(12) United States Patent
Kao et al.

(10) Patent No.: US 9,905,697 B2
(45) Date of Patent: Feb. 27, 2018

(54) ARRAY SUBSTRATE AND METHOD FOR MAKING SAME

(71) Applicant: HON HAI PRECISION INDUSTRY CO., LTD., New Taipei (TW)

(72) Inventors: Yi-Chun Kao, New Taipei (TW); Po-Li Shih, New Taipei (TW); Wei-Chih Chang, New Taipei (TW); I-Wei Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/297,817

(22) Filed: Oct. 19, 2016

(65) Prior Publication Data
US 2017/0179300 A1 Jun. 22, 2017

Related U.S. Application Data

(60) Provisional application No. 62/278,469, filed on Jan. 14, 2016, provisional application No. 62/268,474, filed on Dec. 16, 2015.

(51) Int. Cl.
*H01L 27/12* (2006.01)
*H01L 29/786* (2006.01)
*H01L 21/02* (2006.01)
*H01L 29/24* (2006.01)
*H01L 27/32* (2006.01)

(52) U.S. Cl.
CPC .. *H01L 29/78618* (2013.01); *H01L 21/02491* (2013.01); *H01L 27/124* (2013.01); *H01L 27/1222* (2013.01); *H01L 27/1225* (2013.01); *H01L 27/1262* (2013.01); *H01L 29/24* (2013.01); *H01L 29/7869* (2013.01); *H01L 29/78696* (2013.01); *H01L 27/3262* (2013.01)

(58) Field of Classification Search
CPC ......... H01L 21/02436; H01L 21/02518; H01L 21/70; H01L 21/702; H01L 21/71
See application file for complete search history.

(56) References Cited

U.S. PATENT DOCUMENTS

2004/0263746 A1   12/2004   Cho et al.
2010/0025677 A1*  2/2010    Yamazaki ........... H01L 27/1225
                                                                257/43
(Continued)

FOREIGN PATENT DOCUMENTS

CN           1941299 A       4/2007
CN         101032027 A       9/2007
(Continued)

*Primary Examiner* — Cheung Lee
(74) *Attorney, Agent, or Firm* — ScienBiziP, P.C.

(57) ABSTRACT

A high-performance TFT substrate for a flat panel display includes a substrate, a first conductive layer on the substrate, a semiconductor layer positioned on the first conductive layer, and a second conductive layer positioned on the semiconductor layer. The first conductive layer defines a gate electrode. The second conductive layer defines a source electrode and a drain electrode spaced apart from the source electrode. The second conductive layer includes a first layer on the semiconductor layer and a second layer positioned on the first layer. The first layer can be made of metal oxide. The second layer can be made of aluminum or aluminum alloy.

2 Claims, 4 Drawing Sheets

(56) References Cited

U.S. PATENT DOCUMENTS

2011/0108834 A1* 5/2011 Yamazaki ............... H01L 29/45
 257/43
2013/0299817 A1 11/2013 Park et al.
2016/0197192 A1* 7/2016 Kang .................. H01L 27/1225
 257/43

FOREIGN PATENT DOCUMENTS

| CN | 101226901 A | 7/2008 |
| CN | 101640219 A | 2/2010 |

* cited by examiner

ARRAY SUBSTRATE AND METHOD FOR MAKING SAME

CROSS-REFERENCE TO RELATED APPLICATIONS

This application claims priority from U.S. provisional applications Ser. No. 62/268,474 filed on Dec. 16, 2015, and 62/278,469 filed on Jan. 14, 2016 which are incorporated herein by reference.

FIELD

The subject matter herein generally relates to a thin film transistor (TFT) array substrate, and method for making the TFT substrate.

BACKGROUND

In a flat panel display, a TFT, which is a three-terminal element, is used as the switching element. A gate line transfers a scanning signal for controlling the thin film transistor, a data line transfers a data signal applied to a pixel electrode, as well as other elements are included in the flat panel display. To provide better color accuracy and display response time, a high-performance TFT is needed in a panel display. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
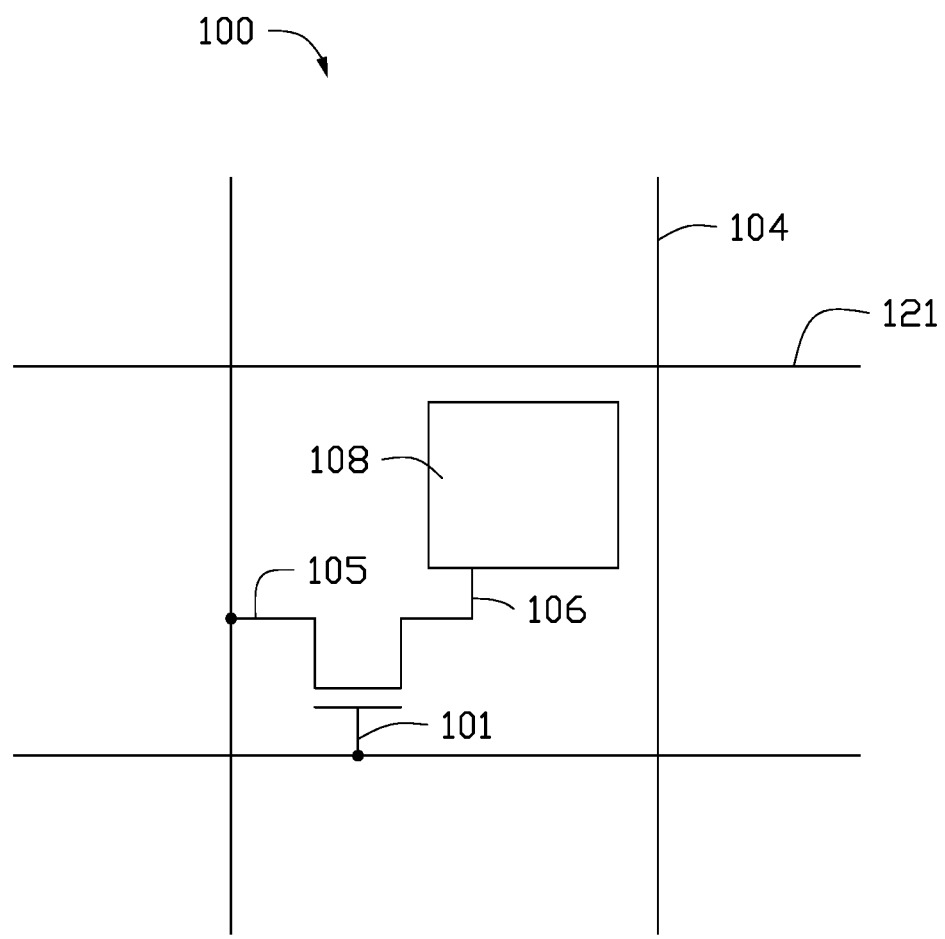
FIG. 1 is a circuit diagram of a portion of a TFT substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
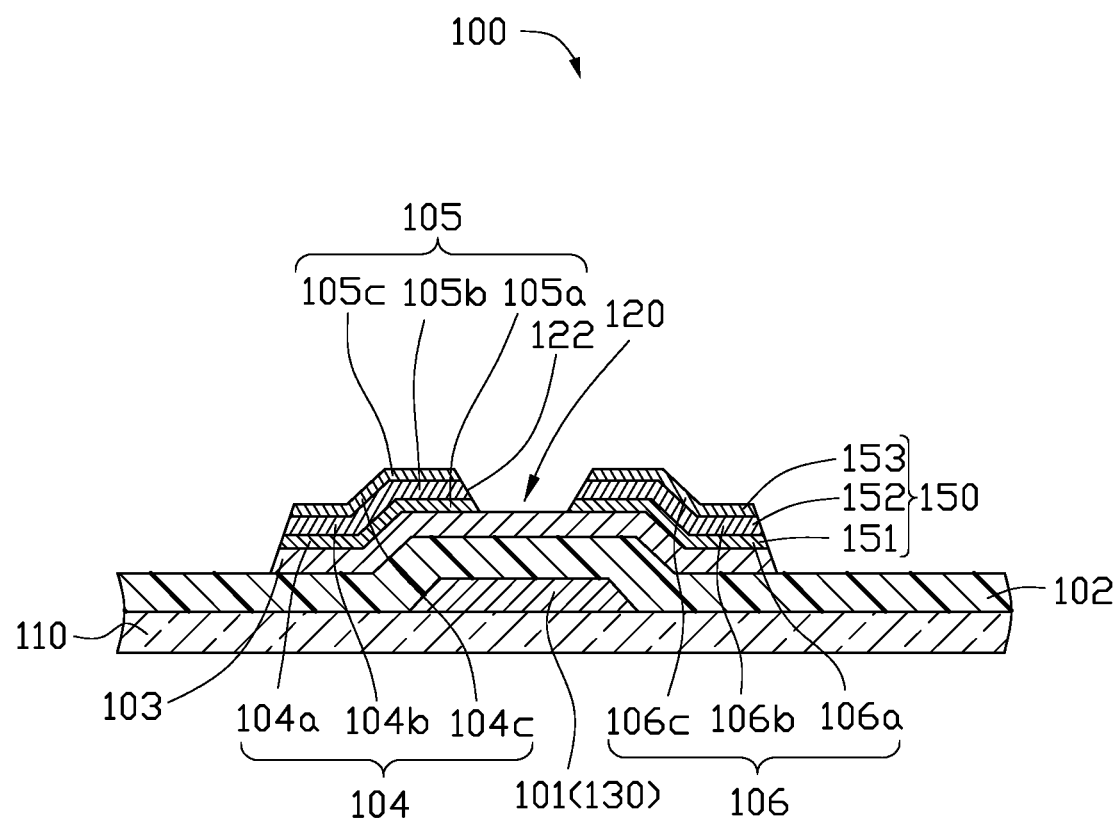
FIG. 2 is a cross-sectional view of an exemplary embodiment of the TFT substrate of FIG. 1.
Figure 3:
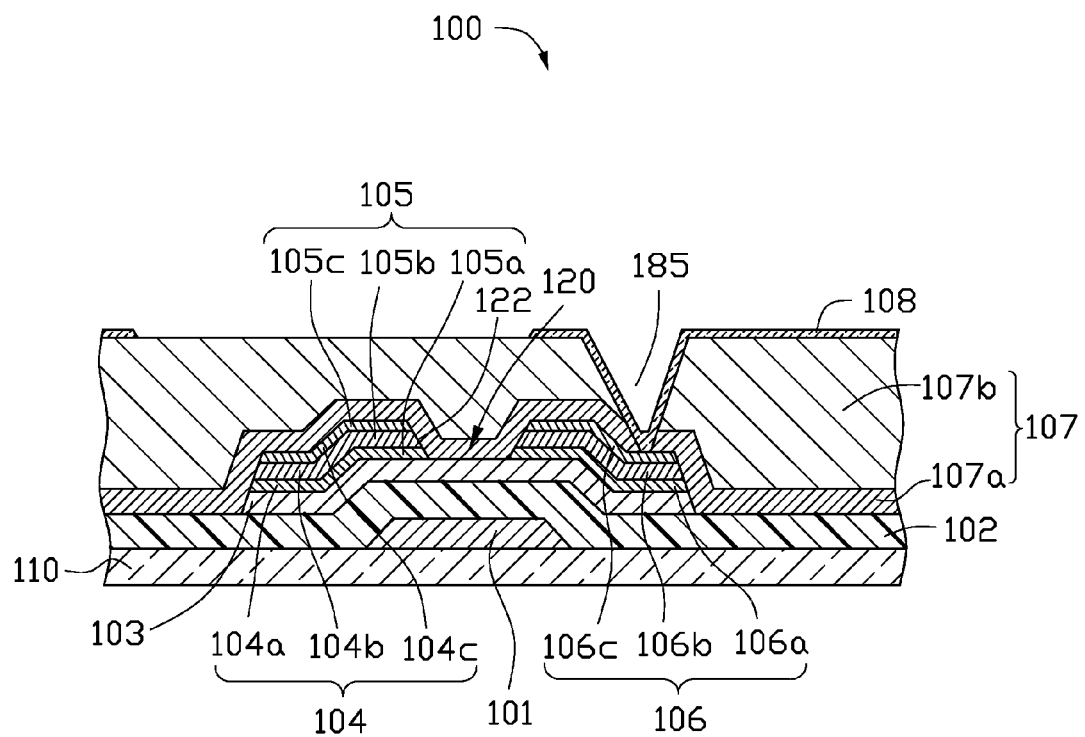
FIG. 3 is a cross-sectional view of an exemplary embodiment of the TFT substrate of FIG. 1.

FIG. 1 through FIG. 3 illustrate a TFT substrate 100. As shown in FIG. 2 and FIG. 3, the TFT substrate 100 includes an insulation substrate 110 and a first conductive layer 130 formed on the insulation substrate 110. The first conductive layer 130 includes a plurality of scanning lines 121 and a plurality of gate electrodes 101 electrically coupled to the plurality of scanning lines 121. FIG. 1 to FIG. 3 show, as an example, only one gate electrode 101 and two scanning lines 121.

The insulation substrate 110 typically comprises an insulating material. Suitable materials for the insulation substrate 110 may include glass, quartz, plastic, and other materials having sufficient optical transparency (e.g., for visual display applications). In some embodiments, the insulation substrate 110 may comprise ceramic and/or silicon materials. In some applications, flexible substrate materials may be adopted. Suitable materials for the flexible substrate may include, for example, polyethersulfone (PES), polyethylene naphthalate (PEN), polyethylene (PE), polyimide (PI), polyvinyl chloride (PVC), and polyethylene terephthalate (PET) or combinations thereof.

Each scanning line 121 is configured to transmit gate signals. Each scanning line 121 extends mainly in a transverse direction, as shown in FIG. 1. The scanning lines 121 and gate electrodes 101 are made of a same material. For example, the scanning lines 121 and gate electrodes 101 may be formed of one of aluminum (Al), copper (Cu), molybdenum (Mo), titanium (Ti), nickel (Ni), tungsten (W), gold (Au), palladium (Pd), platinum (Pt), chromium (Cr), neodymium (Nd), zinc (Zn), cobalt (Co), manganese (Mn), and any mixtures or alloys thereof. In addition, the scanning lines 121 and gate electrodes 101, can comprise, for example, a transparent conductive material such as an indium tin oxide (ITO), an indium zinc oxide (IZO), and an aluminum doped zinc oxide (AZO).

As shown in FIG. 2 and FIG. 3, the TFT substrate 100 further includes a gate insulating layer 102 on the first conductive layer 130. The gate insulating layer 102 can be made of an electrically insulating material. For example, the gate insulating layer 102 may be made of silicon nitride (SiNx), silicon oxide (SiOx), silicon oxynitride (SiOxNy), aluminum oxide (AlOx), yttrium oxide (Y2O3), hafnium oxide (HfOx), zirconium oxide (ZrOx), aluminum nitride (AlN), aluminum oxynitride (AlNO), titanium oxide (TiOx), barium titanate (BaTiO3), lead titanate (PbTiO3), or a combination thereof.

For example, in at least one embodiment, the gate insulating layer 102 can be a single-layer structure, but is not limited thereto. The gate insulating layer may alternatively be formed as, for example, a double-layer structure.

As shown in FIG. 2 and FIG. 3, the TFT substrate 100 further includes a semiconductor layer 103 formed on the gate insulating layer 102. The semiconductor layer 103 can comprise, for example, oxides of at least one of Zn, indium (In), tin (Sn), gallium (Ga), and hafnium (Hf). For example, in at least one embodiment, the semiconductor layer 103 may be made of indium-gallium-zinc oxide (IGZO), indium-zinc-tin oxide (IZTO), indium-gallium-tin oxide (IGTO), or indium-aluminum-zinc oxide (IAZO).

As shown in FIG. 2, the TFT substrate 100 further includes a second conductive layer 150 on the semiconductor layer 103 and the gate insulating layer 102. The second conductive layer 150 includes a plurality of data lines 104, a plurality of source electrodes 105, and a plurality of drain electrodes 106. The plurality of source electrodes 105 and the plurality of drain electrodes 106 are separated from each other. FIG. 1 and FIG. 2, as an example, show only one source electrode 105, one drain electrode 106, and two data lines 104. Each data line 104 is configured to transmit data signals. Each data line 104 extends mainly in a longitudinal direction as shown in FIG. 1, thereby intersecting the scanning lines 121.

The second conductive layer 150 has a triple-layer structure and includes a first layer 151 positioned on the semiconductor layer 103, a second layer 152 positioned on the first layer 151, and a third layer 153 positioned on the second layer 152. That is, each data line 104, each source electrode 105, and each drain electrode 106 have a triple-layer structure. Each data line 104 includes a first layer 104a positioned on the semiconductor layer 103, a second layer 104b positioned on the first layer 104a, and a third layer 104c positioned on the second layer 104b. Each source electrode 105 includes a first layer 105a positioned on the semiconductor layer 103, a second layer 105b positioned on the first layer 105a, and a third layer 105c positioned on the second layer 105b. Each drain electrode 106 includes a first layer 106a positioned on the semiconductor layer 103, a second layer 106b positioned on the first layer 106a, and a third layer 106c positioned on the second layer 106b. The first layer 151 consists of the first layers 104a, 105a, and 106a. The second layer 152 consists of the second layers 104b, 105b, and 106b. The third layer 152 consists of the third layers 104c, 105c, and 106c.

The first layers 104a, 105a, and 106a are made of a same material and are made of metal oxide conductive material. The second layers 104b, 105b, and 106b are made of aluminum or an aluminum alloy. The third layers 104c, 105c, and 106c are made of a same material and are made of metal oxide conductive material. For example, the first layers 104a, 105a, and 106a may be made of one material selected from indium-zinc oxide, gallium-zinc oxide, and aluminum-zinc oxide. The third layers 104c, 105c, and 106c may be made of one material selected from indium-zinc oxide, gallium-zinc oxide, and aluminum-zinc oxide.

A groove 120 is formed between the source electrode 105 and the drain electrode 106 separating the source electrode 105 and the drain electrode 106 from each other. The groove 120 is formed by etching the second conductive layer 150, the groove 120 passes through the first layer 151, the second layer 152, and the third layer 153.

In this embodiment, the first layer 151 and the third layer 153 are made of metal oxides containing the same elements. That is, the first layer 151 and the third layer 153 are made of a same metal oxide. Both the first layer 151 and the third layer 153 contain zinc atoms. For example, both the first layer 151 and the third layer 153 are made of indium-zinc oxide. An atomic percentage of zinc in the third layer 153 is greater than an atomic percentage of zinc in the first layer 151. As such, an etching rate of the third layer 153 is greater than an etching rate of the first layer 151. In this embodiment, the third layer 153 has an etching rate which is greater than that of the second layer 152, and the second layer 152 also has an etching rate which is greater than that of the first layer 151. When the second conductive layer 150 is etched to form the groove 120, the groove 120 includes a side wall 122 which is inclined towards the semiconductor layer 103. The size of the groove 120 gradually decreases along a direction from the third layer 153 towards the first layer 151. The etching rates of the first layer 151, the second layer 152, and the third layer 153 are determined under the condition of the second conductive layer 150 being etched by using a single etching solution or a single etching gas.

The first layer 105a can function as an ohmic contact layer between the semiconductor layer 103 and the second layer 105b; and the first layer 106a can function as an ohmic contact layer between the semiconductor layer 103 and the second layer 106b.

In other exemplary embodiments, the third layers 104c, 105c, and 106c can be omitted. That is, each data line 104, each source electrode 105, and each drain electrode 106 can have a double-layer structure. Each data line 104 includes a first layer 104a and a second layer 104b positioned on the first layer 104a. Each source electrode 105 includes a first layer 105a positioned on the semiconductor layer 103 and a second layer 105b positioned on the first layer 105a. Each drain electrode 106 includes a first layer 106a positioned on the semiconductor layer 103 and a second layer 106b positioned on the first layer 106a. The groove 120 passes through the second layer 152 and the first layer 151, the size of the groove 120 gradually decreasing along a direction from the second layer 152 towards the first layer 151.

One gate electrode 101, one source electrode 105, one drain electrode 106, and one semiconductor layer 103 cooperatively form a TFT. A portion of the semiconductor layer 103 between the source electrode 105 and the drain electrode 106 defines a channel region of the TFT.

As shown in FIG. 3, the TFT substrate 100 further includes a passivation layer 107. The passivation layer 107 covers the source electrodes 105, the drain electrodes 106, the data lines 104, and the semiconductor layers 103. The passivation layer 107 may be made of, for example, an inorganic insulator such as silicon nitride or silicon oxide, an organic insulator, or a low dielectric ratio insulator. For example, the passivation layer 107 may be formed of an organic insulator such as polyimide, polyamide, acrylic resin, epoxy resin, cyclo-olefin resin, or BCB (benzocyclobutene).

In at least one embodiment, the passivation layer 107 may comprise, for example, a lower passivation layer 107a and an upper passivation layer 10b. For example, the lower passivation layer 107a may be made of silicon oxide and the upper passivation layer 107b may be made of silicon nitride.

The passivation layer 107 defines a plurality of contact holes 185 passing through the passivation layer 107. FIG. 2 shows only one contact hole 185. An end of the drain electrode 106 is exposed by the contact hole 185.

As shown in FIG. 3, the TFT substrate 100 further includes a plurality of pixel electrodes 108 formed on the passivation layer 107. FIG. 2 shows one pixel electrode 108. Each pixel electrode 108 is physically and electrically connected to a drain electrode 106 through a contact hole 185, thereby receiving a data voltage from a drain electrode 106.

The pixel electrode 108 may be made of a transparent conductor such as, for example, indium tin oxide (ITO), indium zinc oxide (IZO), aluminum zinc oxide (AZO), cadmium tin oxide (CTO), or a reflective electric conductor such as, for example, aluminum (Al), gold (Au), silver (Ag), copper (Cu), iron (Fe), titanium (Ti), tantalum (Ta), molybdenum (Mo), rubidium (Rb), tungsten (W), and alloys, or combinations thereof. Additionally, the pixel electrode 108 can be formed of, for example, transflective materials or a combination of transparent materials and reflective materials. In other embodiment, the pixel electrode 108 can be an organic light emitting diode (OLED) bottom electrode.

Figure 4:
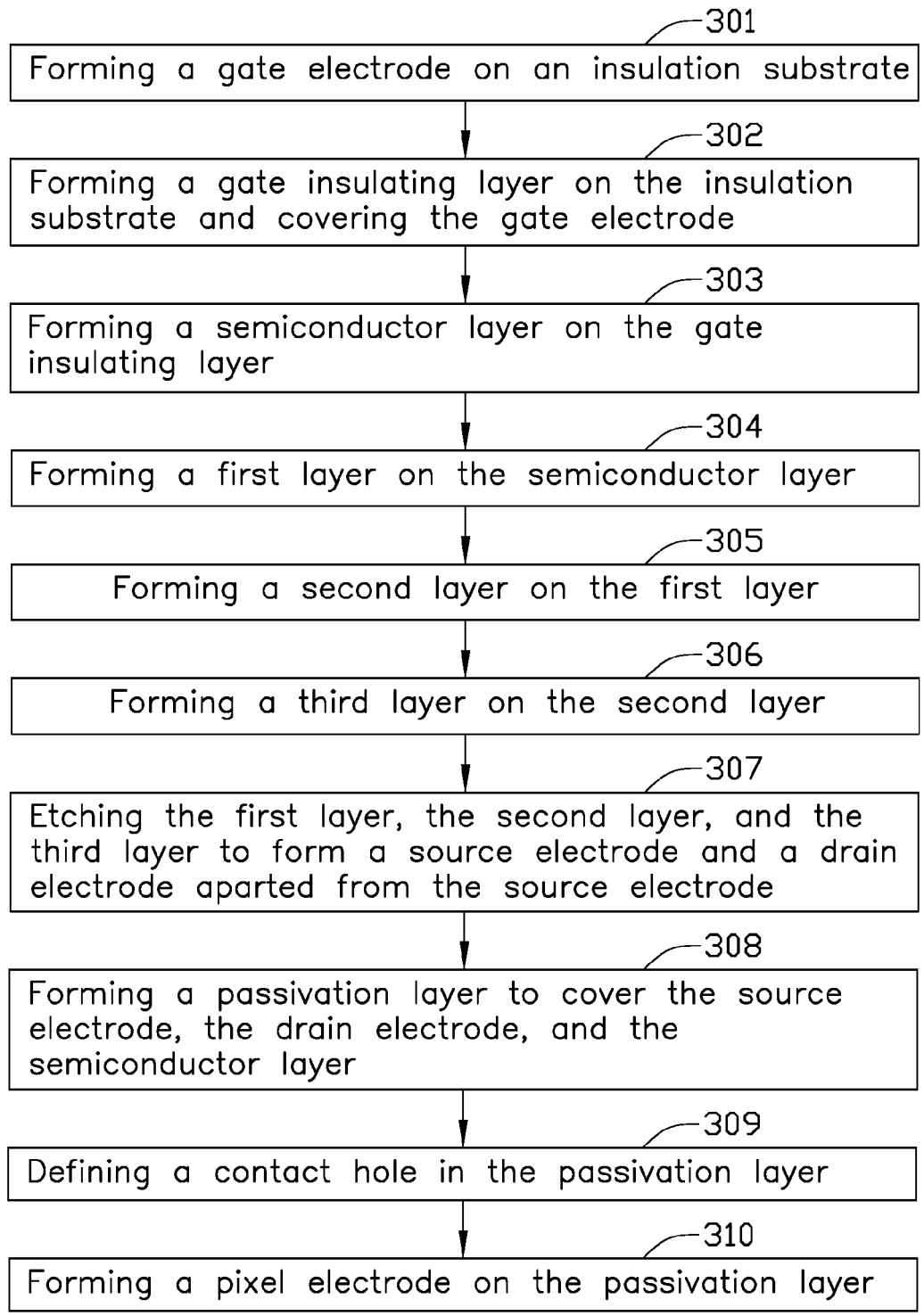
FIG. 4 is a flow chart of a method for making the TFT substrate of FIG. 3.

FIG. 4 illustrates a flow chart of an exemplary method for making the TFT substrate 100 shown in FIG. 3. The method is provided by way of example, as there are a variety of ways for carrying out the method. Each block shown in FIG. 4 represents one or more processes, methods, or subroutines, carried out in the exemplary method. The exemplary method can begin at block 301.

At block 301, an insulation substrate 110 is provided and a gate electrode 101 is formed on the insulation substrate 110. At least one scanning line 121 is electrically coupled to the gate electrode 101 and may also be formed together with the gate electrode 101. The method of forming of the gate electrode 101 and the scanning line 121 may include: depositing a first conductive material layer (not shown) on the insulation substrate 110, and etching and patterning the first conductive material layer to form the gate electrode 101 and the scanning line 121.

At block 302, a gate insulating layer 102 is formed on the insulation substrate 110 and covers the gate electrode 101.

At block 303, a semiconductor layer 103 is formed on the gate insulating layer 102.

At block 304, a first layer 151 is formed on the semiconductor layer 103. The first layer 151 can be made of metal oxide.

At block 305, a second layer 152 is formed on the first layer. The second layer 152 can be made of aluminum or aluminum alloy.

At block 306, a third layer 153 is formed on the second layer. The third layer 153 can be made of metal oxide.

At block 307, the first layer 151, the second layer 152, and the third layer 153 are etched to form a source electrode 105, a drain electrode 106, and at least one data lines 104. A groove 120 is formed during the etch process and the groove 120 passes through the first layer 151, the second layer 152, and the third layer 153. The source electrode 105 is spaced apart from the drain electrode 106 by the groove 120. The size of the groove 120 gradually decreases along a direction from the third layer 153 to the first layer 151.

At block 308, a passivation layer 107 is formed to cover the source electrode 105, the drain electrode 106, and the semiconductor layer 103.

At block 309, a contact hole 185 is defined in the passivation layer 107. The contact hole 185 corresponds to the drain electrode 106 and passes through the passivation layer 107.

At block 310, a pixel electrode 108 is formed on the passivation layer 107. The pixel electrode 108 also extends into the contact hole 185 to electrically couple to the drain electrode 106.

The embodiments shown and described above are only examples. Many details are often found in the art such as other features of a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A TFT substrate comprising:
   a substrate;
   a semiconductor layer formed on the substrate, the semiconductor layer having a top surface and a bottom surface opposite to and facing away from the top surface;
   a first conductive layer formed on the bottom surface of the semiconductor layer, the first conductive layer defining a gate electrode; and
   a second conductive layer formed on the top surface of the semiconductor layer opposite to the first conductive layer, the second conductive layer defining a source electrode and a drain electrode separated from the source electrode;
   wherein the second conductive layer comprises a first layer positioned on the semiconductor layer and a second layer positioned on the first layer; the first layer is made of metal oxide; and the second layer is made of aluminum or aluminum alloy; the first layer functions as an ohmic contact layer between the semiconductor layer and the second layer;
   wherein the second conductive layer further comprises a third layer positioned on the second layer, the third layer is made of metal oxide;
   wherein a groove is defined between the source electrode and the drain electrode; the groove passes through the first layer, the second layer, and the third layer; and wherein the size of the groove gradually decreases along a direction from the third layer to the first layer;
   wherein both the third layer and the first layer are made of metal oxides containing same elements;
   wherein both the third layer and the first layer are made of a same metal oxide containing zinc; and the third layer has an atomic percentage of zinc larger than that of the first layer.

2. A method for making a TFT substrate comprising:
   forming a gate electrode on a substrate;
   forming a gate insulating layer on the substrate and covering the gate electrode;
   forming a semiconductor layer on the gate insulating layer;
   forming a first layer on the semiconductor layer, the first layer being made of metal oxide;
   forming a second layer on the first layer, the second layer being made of aluminum or aluminum alloy;
   forming a third layer on the second layer, the third layer being made of metal oxide;
   etching the first layer, the second layer, and the third layer to form a source electrode and a drain electrode spaced apart from the source electrode;
   wherein the first layer functions as an ohmic contact layer between the semiconductor layer and the second layer;
   wherein both the third layer and the first layer are made of a same metal oxide containing zinc; and the third layer has an atomic percentage of zinc larger than that of the first layer.

* * * * *